(12) United States Patent
Lee

(10) Patent No.: US 7,278,583 B2
(45) Date of Patent: Oct. 9, 2007

(54) COMPOSITE COMPACT FLASH CARD

(75) Inventor: Jiunn-Chung Lee, Taipei (TW)

(73) Assignee: Apacer Technology, Inc., Taipei (TW)

( * ) Notice: Subject to any disclaimer, the term of this patent is extended or adjusted under 35 U.S.C. 154(b) by 231 days.

(21) Appl. No.: 11/127,744

(22) Filed: May 12, 2005

(65) Prior Publication Data
US 2006/0080488 A1    Apr. 13, 2006

(30) Foreign Application Priority Data
Oct. 12, 2004    (TW) .............................. 93130884 A

(51) Int. Cl.
*G06K 19/06* (2006.01)
(52) U.S. Cl. ...................... 235/492; 235/486
(58) Field of Classification Search ............... 235/492, 235/449, 487, 486, 475, 476; 361/737, 764; 439/630, 91, 492, 484
See application file for complete search history.

(56) References Cited

U.S. PATENT DOCUMENTS

| | | | |
|---|---|---|---|
| 6,176,724 B1* | 1/2001 | Klatt et al. ................. | 439/326 |
| 6,932,275 B2* | 8/2005 | Mambakkam et al. ....... | 235/486 |
| 7,095,618 B1* | 8/2006 | Mambakkam et al. ....... | 361/737 |
| 2003/0038968 A1* | 2/2003 | Kawaura ..................... | 358/1.15 |
| 2004/0024916 A1* | 2/2004 | Hsing ............................. | 710/1 |
| 2004/0184246 A1* | 9/2004 | Le et al. ...................... | 361/764 |
| 2005/0030704 A1* | 2/2005 | Sun et al. .................... | 361/679 |
| 2005/0100197 A1* | 5/2005 | Kita ............................ | 382/124 |
| 2006/0086792 A1* | 4/2006 | Chen et al. .................. | 235/441 |
| 2006/0268114 A1* | 11/2006 | Chan et al. ............... | 348/207.1 |

* cited by examiner

*Primary Examiner*—Thien Minh Le

(57) ABSTRACT

A composite Compact Flash card includes a storage unit, a slot, a mechanical switch, a switch detecting circuit and a control unit. The slot is used for plugging an external small-sized memory card therein. The mechanical switch is electrically connected to the slot for selecting one of the storage unit and the small-sized memory card to store data therein and generating a switching signal according to the selecting result. The switch detecting circuit is electrically connected to the mechanical switch, and generates a control signal in response to the switching signal. The control unit is electrically connected to the storage unit, the slot and the switch detecting circuit for controlling an accessing operation of the storage unit or the small-sized memory card.

16 Claims, 3 Drawing Sheets

US 7,278,583 B2

COMPOSITE COMPACT FLASH CARD

FIELD OF THE INVENTION

The present invention relates to a Compact Flash card, and more particularly to a composite Compact Flash card.

BACKGROUND OF THE INVENTION

With digitalized trend, many consumable electronic products are developed to integrate high-quality digital signals into diverse apparatuses. With increasing development of microelectronic technologies, the functions of the consumable electronic products are diverse and the sizes of the consumable electronic products are minimized. In addition, these consumable electronic products become essential because they are portable and convenient.

Nowadays, since the consumable electronic products such as digital still cameras and personal digital assistants (PDAs) are popular, memory cards are more important. Generally, the memory cards are employed to store data files such as the image captured from the digital still camera or the data files stored in the personal digital assistant.

The common standard specifications of memory cards comprise for example Compact Flash cards (CF cards), Secure Digital cards (SD cards), Multi-Media cards (MMC cards), Memory Stick cards (MS cards), and so on. Since the CF card has the largest volume and area among these memory cards and a high market share, the CF card is widely used in the consumable electronic products. In contrast, since the SD card, the MMC card, the XD card and the MS card have smaller volumes and areas, these cards are classified as small-sized memory cards.

Referring to FIG. 1, a schematic circuit configuration of a conventional CF card is shown. The CF card 10 comprises a CF interface connector 11, a control unit 12 and a flash memory 13. Via the CF interface connector 11, the CF card 10 can be in communication with an external electronic device (not shown) compatible with the CF interface. By the control unit 12, data are read or stored from/into the flash memory 13.

As known, specified memory cards are compatible with specified digital still cameras or personal digital assistants. If the memory card is incompatible with the electronic product, the problem of wasting resources occurs. For example, if a user has originally a personal digital assistant compatible with the CF card and wants to buy another personal digital assistant compatible with the MMC card, it is necessary to buy the MMC card because the original CF card fails to be used in the new personal digital assistant.

In view of the above-described disadvantages resulted from the prior art and the advantages of the conventional CF card, the applicant has diligently developed a composite CF card according to the present invention through wholehearted experience and research.

SUMMARY OF THE INVENTION

It is an object of the present invention to provide a composite CF card having additional memory space for accessing the external small-sized memory card so as to increase convenience and flexibility thereof and overcome the problem of resource waste.

In accordance with a first aspect of the present invention, there is provided a composite Compact Flash card. The composite Compact Flash card comprises a storage unit, a slot, a mechanical switch, a switch detecting circuit and a control unit. The slot is used for plugging an external small-sized memory card therein. The mechanical switch is electrically connected to the slot for selecting one of the storage unit and the small-sized memory card to store data therein and generating a switching signal according to the selecting result. The switch detecting circuit is electrically connected to the mechanical switch, and generates a control signal in response to the switching signal. The control unit is electrically connected to the storage unit, the slot and the switch detecting circuit for controlling an accessing operation of the storage unit or the small-sized memory card.

Preferably, the storage unit is a flash memory.

In an embodiment, the control unit comprises a controller, a random access memory (RAM) and a read-only memory (ROM). The controller is electrically connected to the switch detecting circuit for controlling the accessing operation of the storage unit or the small-sized memory card in response to the control signal. The random access memory (RAM) and the read-only memory (ROM) are electrically connected to the controller so as to store data required for the controller.

In an embodiment, the control unit further comprises a flash memory management layer circuit and a small-sized memory card protocol layer. The flash memory management layer circuit is electrically connected to the flash memory and the controller for using as a first communication medium between the flash memory and the controller. The small-sized memory card protocol layer is connected to the slot and the controller for using as a second communication medium between the slot and the controller.

In an embodiment, the composite Compact Flash card further comprises a CF interface connector electrically connected to the control unit and an external electronic device compatible with a CF interface.

Preferably, the external electronic device is a card reader, a digital still camera, a personal digital assistant, a personal computer or a portable hard disc.

Preferably, the small-sized memory card is selected from a group consisting of a SD card, a MMC card, a XD card and a MS card.

In accordance with a second aspect of the present invention, there is provided a composite Compact Flash card. The composite Compact Flash card comprises a plastic frame, a substrate, a slot and a plurality of electronic components. The substrate is disposed within the plastic frame. The slot is disposed within the plastic frame and arranged on a first surface of the substrate for plugging an external small-sized memory card therein. The plurality of electronic components arranged on a second surface of the substrate.

In an embodiment, the composite Compact Flash card further comprises a first metallic cover and a second metallic cover. The first metallic cover is disposed above the plastic frame. The second metallic cover is disposed under the plastic frame. The first metallic cover, the plastic frame and the second metallic cover are formed into a memory card package box.

In an embodiment, the substrate is a printed circuit board.

In an embodiment, the electronic components include a control unit, a flash memory and a switch detecting circuit.

In accordance with a third aspect of the present invention, there is provided a composite Compact Flash card. The composite Compact Flash card comprises a plastic frame, a substrate, a slot and an electronic chip. The substrate is disposed within the plastic frame. The slot is disposed within the plastic frame and arranged on a first surface of the substrate for plugging an external small-sized memory card therein. The electronic chip is arranged on the first surface of the substrate and adjacent to the slot.

In an embodiment, the electronic chip includes a control unit, a flash memory and a switch detecting circuit, which are packaged in a stacked form.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
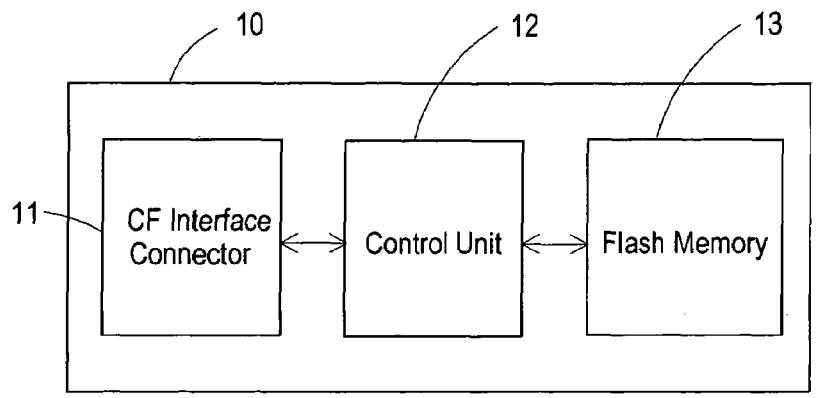
FIG. 1 is a schematic circuit configuration of a conventional CF card.
Figure 2:
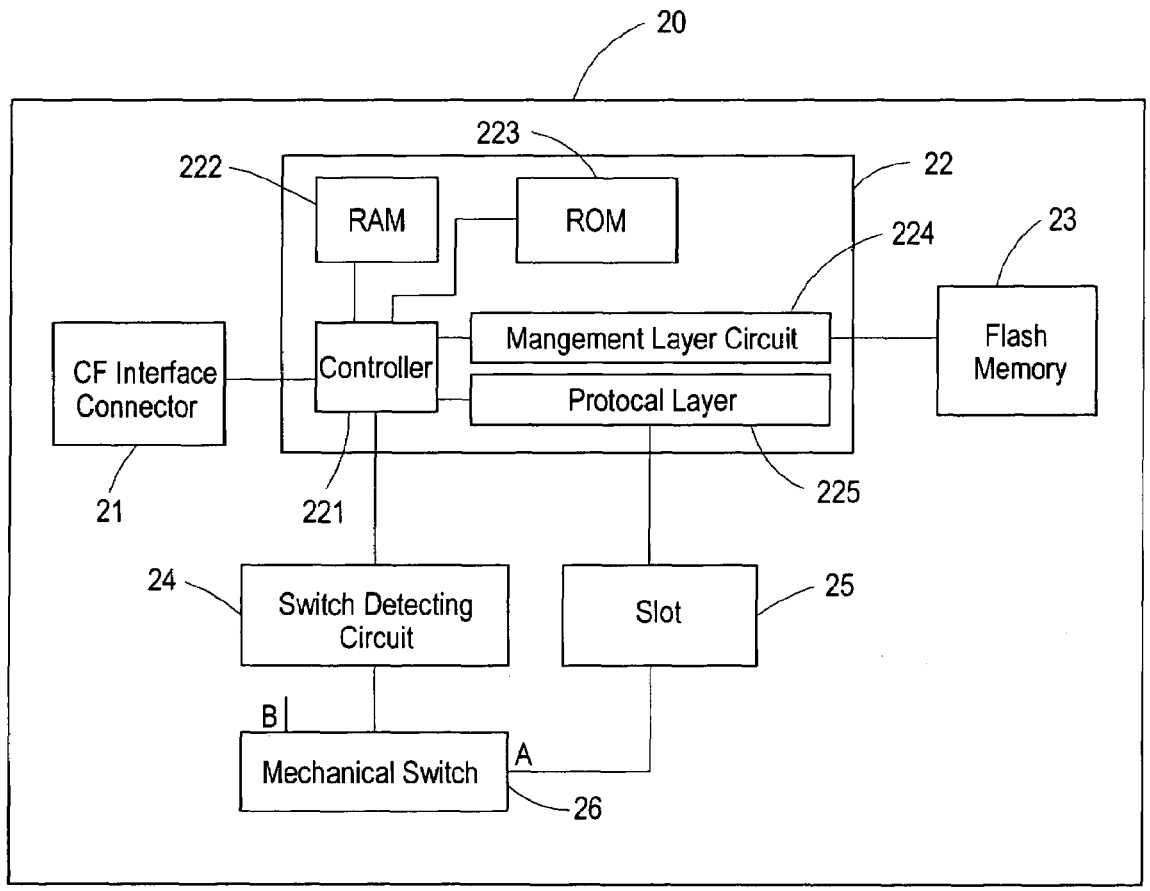
FIG. 2 is a schematic circuit configuration of a composite CF card according to a preferred embodiment of the present invention.

Referring to FIG. 2, a schematic circuit configuration of a composite CF card according to a preferred embodiment of the present invention is shown. The composite CF card 20 comprises a CF interface connector 21, a control unit 22, a storage unit 23, a switch detecting circuit 24, a slot 25 and a mechanical switch 26. The composite CF card 20 has additional memory space for accessing the small-sized memory card so as to enhance the memory space of the composite CF card 20 and the compatibility between the composite CF card 20 and the small-sized memory card. An exemplary storage unit 23 is a flash memory, which is a built-in memory space of the composite CF card 20 for storing data files.

Via the CF interface connector 21, the composite CF card 20 can be in communication with an external electronic device (not shown) compatible with the CF interface. Examples of the external electronic device include but are not limited to card readers, digital still cameras, personal digital assistants, personal computers or portable hard discs.

The slot 25 is electrically connected to control unit 22 and the mechanical switch 26 for plugging the small-sized memory card (not shown) therein. The control unit 22 can read or store data from/into the small-sized memory card.

The mechanical switch 26 has a select button (not shown) and two terminals A and B. By means of the mechanical switch 26, either the flash memory 23 of the composite CF card 20 or the small-sized memory card plugged in the slot 25 is manually selected as the memory space for storing data. On one hand, if the select button of the mechanical switch 26 is stirred such that the terminal A is selected to electrically connect with the small-sized memory card plugged in the slot 25, the small-sized memory card is employed to store data. In this circumstance, the composite CF card 20 can directly access the external small-sized memory card. That is to say, the external electronic device compatible with the CF interface will be communicated with the controller 221 of the control unit 22 via the CF interface connector 21, and directly access the external small-sized memory card by means of the controller 221. On the other hand, if the select button of the mechanical switch 26 is stirred such that the terminal B is electrically connected with the flash memory 23 but the terminal A is disconnected with the slot 25. In this circumstance, the composite CF card 20 can directly access the flash memory 23, and be used as the general CF card. According to the selecting result, a switching signal is asserted from the mechanical switch 26.

The switch detecting circuit 24 is electrically connected to the mechanical switch 26. In response to the switching signal issued from the mechanical switch 26, a control signal is generated from the switch detecting circuit 24.

The control unit 22 is electrically connected to the CF interface connector 21, the flash memory 23, the switch detecting circuit 24 and the slot 25, and comprises the controller 221, a random access memory (RAM) 222, a read-only memory (ROM) 223, a flash memory management layer circuit 224 and a small-sized memory card protocol layer 225. In response to the control signal issued from the switch detecting circuit 24, the controller 221 will control the reading/writing operations of the built-in flash memory 23 of the composite CF card 20 or the small-sized memory card. Once the composite CF card 20 of the present invention is inserted into the external electronic device compatible with the CF interface, the external electronic device can access the built-in flash memory 23 or the small-sized memory card.

The random access memory (RAM) 222 and the read-only memory (ROM) 223 are employed to store the data required for operating the controller 221. The flash memory management layer circuit 224 is electrically connected to the flash memory 23 and the controller 221 and used as a first communication medium between the flash memory 23 and the controller 221. The small-sized memory card protocol layer 225 is connected to the slot 25 and the controller 221 and used as a second communication medium between the slot 225 and the controller 221. In such manner, the small-sized memory card will be in communication with the controller 221 of the composite CF card 20 via the slot 25. Since the controller 221 selectively controls the flash memory 23 and the small-sized memory card according to the selecting result of the mechanical switch 26, the functions of the composite CF card 20 are enhanced.

Examples of the small-sized memory card include but are limited to SD cards, MMC cards, XD cards, MS cards or other cards having smaller volume and area than the CF card and capable of being plugged in the slot 25.

The composite CF card 20 in the above embodiments conforms to the standards proposed by Compact Flash Association. These standards include two types, i.e. a TYPE I standard (height: 3.3 mm) and a TYPE II standard (height: 5.0 mm). The area of each type is 36.4 mm×42.8 mm, which is smaller than that of this memory card. The CF interface connector 21 is a 50-pin receptacle and has the largest transmission speed among the existing memory cards. The data transmission interface can be operated in a memory mode, an I/O mode and a true-IDE mode.

Figure 3A:
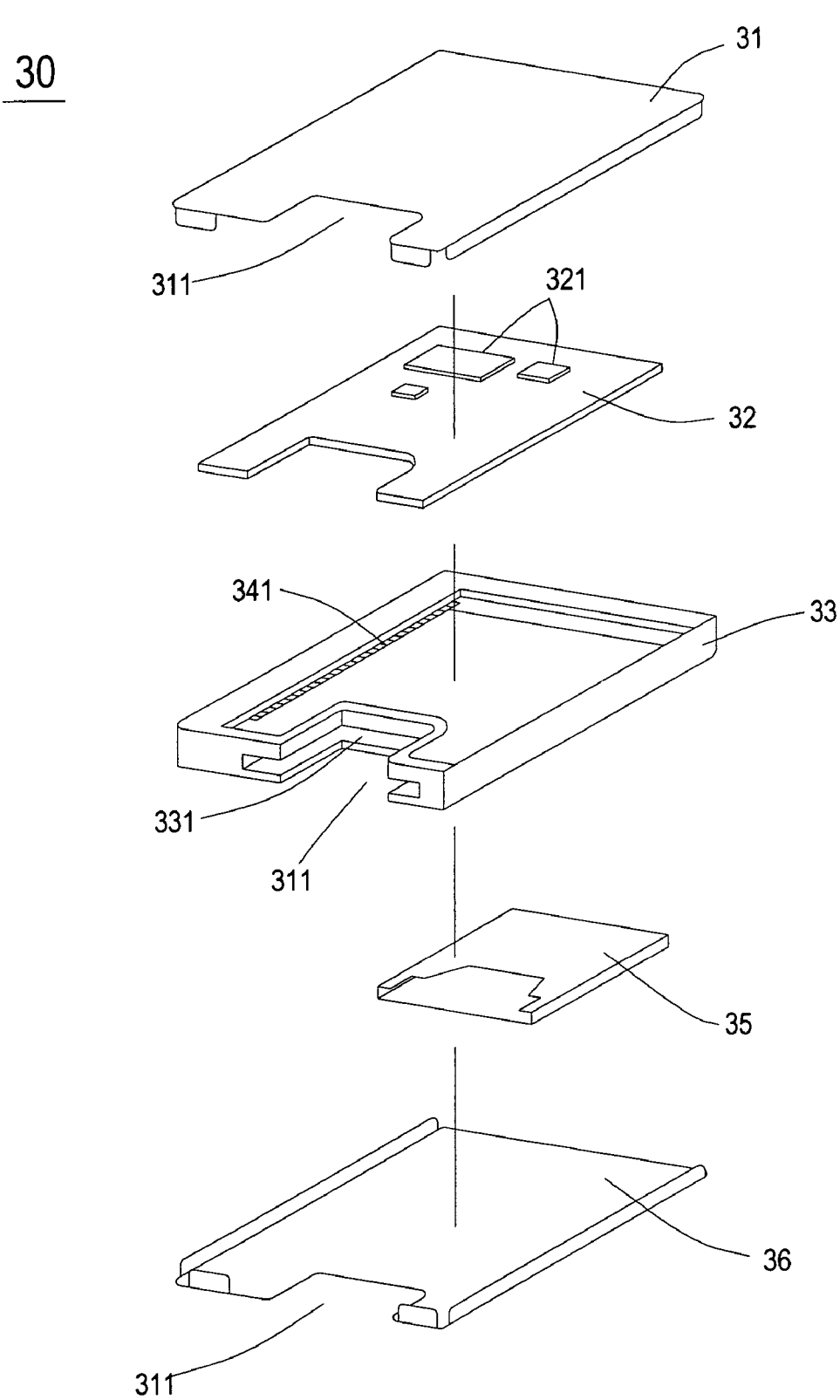
FIG. 3(a) is an exploded view of a composite CF card according to the present invention.
Figure 3B:
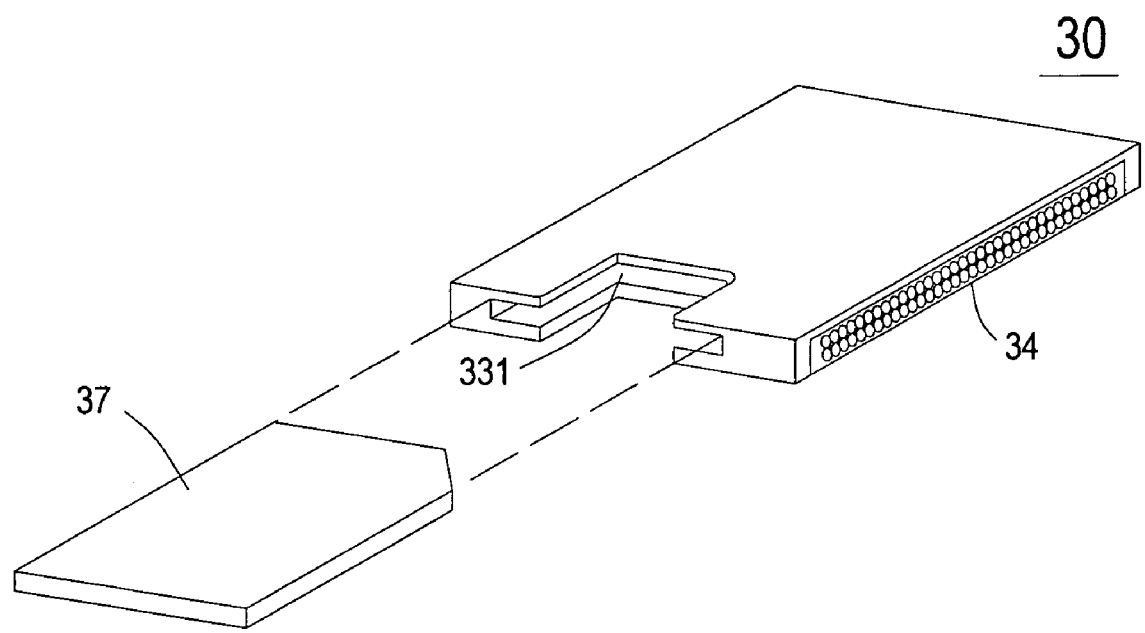
FIG. 3(b) is an assembled view of a composite CF card according to the present invention.

FIG. 3(a) is an exploded view of a composite CF card according to the present invention, and FIG. 3(b) is an assembled view of a composite CF card according to the present invention. The composite CF card 30 conforms to the TYPE II standard (height: 5.0 mm), and comprises a first metallic cover 31, a substrate 32, a plastic frame 33, a CF interface connector 34, a slot 35 and a second metallic cover 36.

The first metallic cover 31 is disposed above the plastic frame 33. The second metallic cover 36 is disposed under the plastic frame 33. The first metallic cover 31, the plastic frame 33 and the second metallic cover 36 are formed into a memory card package box as shown in FIG. 3(*b*). In this embodiment, a U-shaped notch 311 is arranged in the memory card package box for facilitating inserting or removing the small-sized memory card 37.

The substrate 32 is a printed circuit board disposed between the plastic frame 33 and the first metallic cover 31. Several electronic components 321 including the control unit 22, the flash memory 23 and the switch detecting circuit 24 as shown in FIG. 2 are mounted on the printed circuit board 32. The CF interface connector 34 is disposed on one side of the plastic frame 33. The inner side of the CF interface connector 34 has a plurality of pins 341 electrically connected to the printed circuit board 32 and the slot 35. Whereas, the outer side of the CF interface connector 34 is electrically connected to the external electronic device compatible with the CF interface. A recess structure 331 is formed in the plastic frame 33 corresponding to the U-shaped notch 311. The small-sized memory card 37 can be inserted into the slot 35 via the recess structure 331. The slot 35 is disposed within the plastic frame 33 and on a first surface of the printed circuit board 32 for inserting the small-sized memory card 37 therein.

The composite CF card 30 conforming to the TYPE II standard (height: 5.0 mm) has the layout configuration as follows. The slot 35 for accommodating the small-sized memory card 37 and the electronic components 321 are disposed on the first and second surfaces of the printed circuit board 32, respectively. The height of the slot 35 for the existing small-sized memory card such as the SD card or MMC card is approximately 2.65 mm, and that for MS card is approximately 2.4 mm. Since the overall height of the electronic component 321 (1.2 mm), the printed circuit board 32 (0.4 mm) and the slot 35 (2.65 mm or 2.4 mm) is less than the height specification of the TYPE II standard (height: 5.0 mm), the total height of the composite CF card 30 including the first metallic cover 31 and the second metallic cover 32 conforms with the TYPE II standard. Accordingly, the composite CF card 30 of the present invention is applied to any peripheral devices compatible with the TYPE II-standard CF card, for example card readers, digital still cameras, personal digital assistants, personal computers or portable hard discs.

Figure 4:
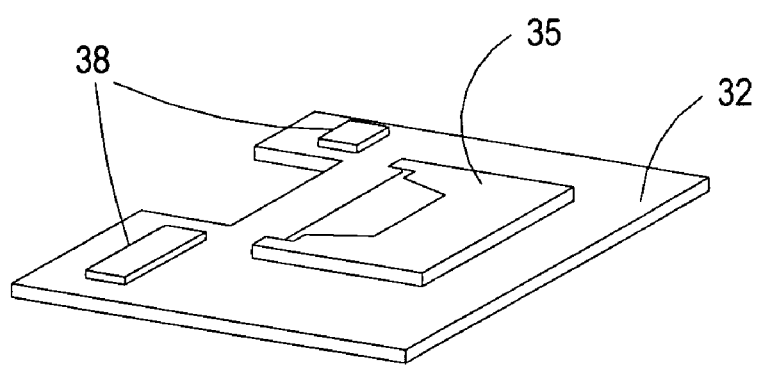
FIG. 4 is a schematic view of a printed circuit board used in a composite CF card according to another embodiment of the present invention.

The composite CF card 30 conforming to the TYPE I standard (height: 3.3 mm) has the layout configuration as follows. The control unit 22, the flash memory 23 and the switch detecting circuit 24 are packaged as microelectronic chips 38 in a stacked form as shown in FIG. 4, thereby reducing the overall volume thereof. The microelectronic chips 38 and the slot 35 are disposed on the first surface of the printed circuit board 32 and conforms to the TYPE I standard. In this embodiment, no component is disposed on the second surface of the printed circuit board 32, but all components including the slot 35 and the microelectronic chips 38 are disposed on the first surface of the printed circuit board 32. The microelectronic chips 38 are disposed on opposite sides of the printed circuit board 32 and adjacent to the slot 35. Since the overall height of the printed circuit board 32 (0.4 mm) and the slot 35 (2.65 mm or 2.4 mm) is less than the height specification of the TYPE I standard (height: 3.3 mm), the total height of the composite CF card 30 including the first metallic cover 31 and the second metallic cover 32 conforms with the TYPE I standard. Accordingly, the composite CF card 30 of the present invention is applied to any peripheral devices compatible with the TYPE I-standard CF card, for example card readers, digital still cameras, personal digital assistants, personal computers or portable hard discs.

From the above description, in addition to the original memory space of the conventional CF card, the composite CF card of the present invention has additional memory space for accessing the external small-sized memory card. In other words, the composite CF card of the present invention can be used as a CF card or a small-sized memory card so as to increase convenience and flexibility thereof and overcome the problem of resource waste.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A composite Compact Flash card comprising:
    a storage unit;
    a slot for plugging an external small-sized memory card therein;
    a mechanical switch electrically connected to said slot for selecting one of said storage unit and said small-sized memory card to store data therein and generating a switching signal according to the selecting result;
    a switch detecting circuit electrically connected to said mechanical switch, and generating a control signal in response to said switching signal; and
    a control unit electrically connected to said storage unit, said slot and said switch detecting circuit for controlling an accessing operation of said storage unit or said small-sized memory card.

2. The composite Compact Flash card according to claim 1 wherein said storage unit is a flash memory.

3. The composite Compact Flash card according to claim 2 wherein said control unit comprises:
    a controller electrically connected to said switch detecting circuit for controlling said accessing operation of said storage unit or said small-sized memory card in response to said control signal; and
    a random access memory (RAM) and a read-only memory (ROM) electrically connected to said controller so as to store data required for said controller.

4. The composite Compact Flash card according to claim 3 wherein said control unit further comprises:
    a flash memory management layer circuit electrically connected to said flash memory and said controller for using as a first communication medium between said flash memory and said controller; and
    a small-sized memory card protocol layer connected to said slot and said controller for using as a second communication medium between said slot and said controller.

5. The composite Compact Flash card according to claim 1 further comprising a CF interface connector electrically connected to said control unit and an external electronic device compatible with a CF interface.

6. The composite Compact Flash card according to claim 5 wherein said external electronic device is a card reader, a digital still camera, a personal digital assistant, a personal computer or a portable hard disc.

7. The composite Compact Flash card according to claim 1 wherein said small-sized memory card is selected from a group consisting of a SD card, a MMC card, a XD card and a MS card.

8. A composite Compact Flash card comprising:
a plastic frame;
a substrate disposed within said plastic frame;
a slot disposed within said plastic frame and arranged on a first surface of said substrate for plugging an external small-sized memory card therein; and
a plurality of electronic components arranged on a second surface of said substrate wherein said electronic components further include a control unit, a fresh memory card and a switch detecting circuit.

9. The composite Compact Flash card according to claim 8 further comprising:
a first metallic cover disposed above said plastic frame; and
a second metallic cover disposed under said plastic frame, wherein said first metallic cover, said plastic frame and said second metallic cover are formed into a memory card package box.

10. The composite Compact Flash card according to claim 8 wherein said substrate is a printed circuit board.

11. The composite Compact Flash card according to claim 8 wherein said small-sized memory card is selected from a group consisting of a SD card, a MMC card, a XD card and a MS card.

12. A composite Compact Flash card comprising:
a plastic frame;
a substrate disposed within said plastic frame;
a slot disposed within said plastic frame and arranged on a first surface of said substrate for plugging an external small-sized memory card therein; and
an electronic chip arranged on said first surface of said substrate and adjacent to said slot wherein said electronic chip includes a control unit, a flash memory and a switch detecting circuit.

13. The composite Compact Flash card according to claim 12 further comprising:
a first metallic cover disposed above said plastic frame; and
a second metallic cover disposed under said plastic frame, wherein said first metallic cover, said plastic frame and said second metallic cover are formed into a memory card package box.

14. The composite Compact Flash card according to claim 12 wherein said substrate is a printed circuit board.

15. The composite Compact Flash card according to claim 12 wherein said small-sized memory card is selected from a group consisting of a SD card, a MMC card, a XD card and a MS card.

16. The composite Compact Flash card according to claim 12 wherein said control unit, said flash memory and said switch detecting circuit are packaged in a stacked form.

* * * * *